US012601781B2

(12) United States Patent
Bollati

(10) Patent No.: US 12,601,781 B2
(45) Date of Patent: Apr. 14, 2026

(54) BUILT-IN SELF-TEST CIRCUIT AND METHOD FOR DEADTIME TRIMMING

(71) Applicant: SEMICONDUCTOR COMPONENTS INDUSTRIES, LLC, Scottsdale, AZ (US)

(72) Inventor: Andrea Bollati, Parabiago (IT)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 260 days.

(21) Appl. No.: 18/429,855

(22) Filed: Feb. 1, 2024

(65) Prior Publication Data

US 2025/0251442 A1    Aug. 7, 2025

(51) Int. Cl.
| | |
|---|---|
| *G01R 31/28* | (2006.01) |
| *G01R 31/40* | (2020.01) |
| *H03K 17/687* | (2006.01) |
| *H03K 19/0185* | (2006.01) |

(52) U.S. Cl.
CPC ......... *G01R 31/2856* (2013.01); *G01R 31/40* (2013.01); *H03K 17/6871* (2013.01); *H03K 19/018521* (2013.01); *H03K 19/01855* (2013.01); *H03K 2217/0063* (2013.01); *H03K 2217/0072* (2013.01)

(58) Field of Classification Search
CPC ................ G01R 31/2856; G01R 31/40; H03K 17/6871; H03K 19/018521; H03K 19/01855; H03K 2217/0063; H03K 2217/0072; H02M 1/385; H02M 1/0003
USPC ................................ 324/750.03, 750.01, 537
See application file for complete search history.

(56) References Cited

U.S. PATENT DOCUMENTS

| | | | | |
|---|---|---|---|---|
| 6,281,708 B1 * | 8/2001 | Kenny | ............. | H03K 19/01721 |
| | | | | 326/86 |
| 8,519,747 B2 * | 8/2013 | Cho | ............... | H03K 19/018521 |
| | | | | 327/170 |
| 8,710,873 B2 * | 4/2014 | Barrenscheen | ......... | H02M 1/08 |
| | | | | 327/108 |
| 2003/0090293 A1 * | 5/2003 | Yen | ....................... | H03K 17/164 |
| | | | | 326/86 |
| 2005/0285647 A1 * | 12/2005 | Wilson | ..................... | H03K 5/01 |
| | | | | 327/172 |
| 2008/0065934 A1 * | 3/2008 | Whetsel | ........... | G01R 31/31722 |
| | | | | 714/701 |
| 2008/0224677 A1 | 9/2008 | Kim et al. | | |

(Continued)

OTHER PUBLICATIONS

Onsemi, "Smart Power Stage (SPS) Modules with Integrated Current and Temperature Monitors," FDMF5049 Data Sheet, Publication Order No. FDMF5049/D, Dec. 2022, Rev. 0, 17 pages.

*Primary Examiner* — Giovanni Astacio-Oquendo
(74) *Attorney, Agent, or Firm* — Ramey LLP

(57) ABSTRACT

Illustrative test circuits and methods are provided for determining deadtime of a switched power supply (SPS) driver. The test circuit can be configured to couple a selected gate signal selected from a high side gate signal of a driver and a low side gate signal of the driver to an input of the driver via a feedback path that causes the selected gate signal to oscillate with a period indicative of propagation time delays of the driver from which a deadtime measurement can be determined. In some implementations, the test circuits and methods may be embodied as a built-in self-test module integrated into the controller chip for the SPS.

25 Claims, 3 Drawing Sheets

(56)            References Cited

U.S. PATENT DOCUMENTS

| | | |
|---|---|---|
| 2015/0256074 A1 | 9/2015 | Biondi et al. |
| 2018/0026737 A1* | 1/2018 | Kucheravy ............. H04L 1/248 |
| | | 375/227 |
| 2020/0166572 A1* | 5/2020 | Whetsel ......... G01R 31/318508 |

* cited by examiner

FIG. 4
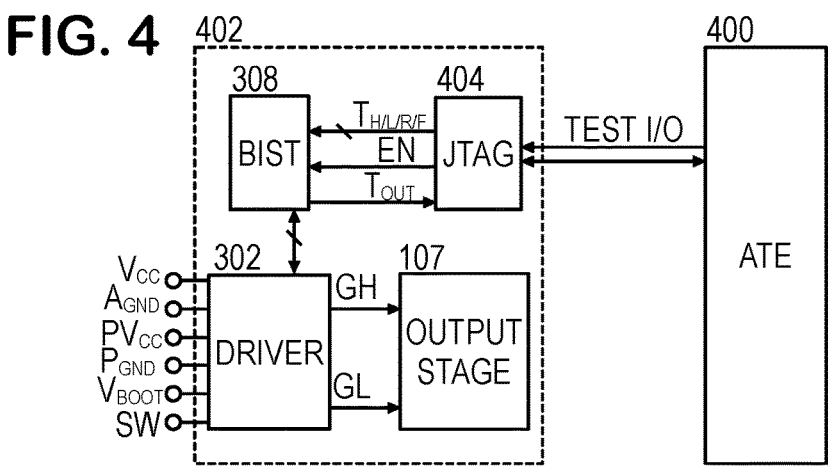
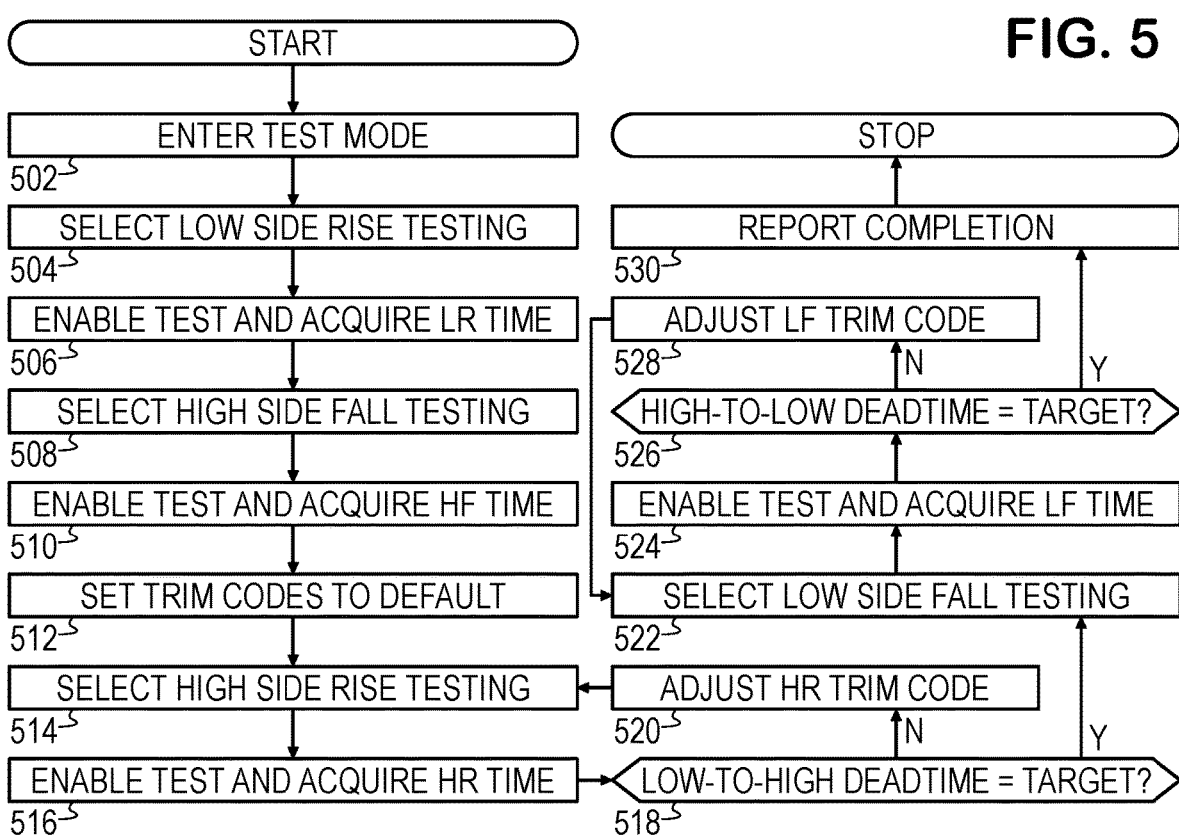
FIG. 5

BUILT-IN SELF-TEST CIRCUIT AND METHOD FOR DEADTIME TRIMMING

TECHNICAL FIELD

The present disclosure relates in general to switched power supply controllers and, more particularly, to a built-in self-test circuit and method for determining deadtime.

BACKGROUND

A switched-mode power supply (SPS) offers efficient AC-DC and DC-DC voltage conversion. Unlike linear power supplies, the output transistor(s) of an SPS are designed to operate in low-dissipation full-on and full-off states, spending very little time in transitions to minimize power dissipation. The SPS achieves voltage regulation using pulse width modulation (PWM) or other means for varying the ratio of on-to-off time.

Traditional SPS circuits such as buck, boost, buck-boost, and Ćuk converters, provide a switched node between a switching transistor and a diode that conducts only when the transistor is off. However, the diode causes power dissipation by sustaining a voltage drop when conducting. It is consequently more efficient to employ a half-bridge design that replaces the diode with a second switching transistor operating in alternation with the first transistor.

While offering reduced power dissipation, the half-bridge circuits create a risk of cross-conduction should both switching transistors ever be on at the same time. Even if the cross-conduction is brief, it hurts efficiency and causes excessive current flow that can damage or destroy the switching transistors. It is generally preferred to protect against cross-conduction over a wide range of process variations that may cause performance differences for some of the mass-manufactured switching controllers. This protection may take the form of an engineered "deadtime" between turning off one switching transistor and turning on the other switching transistor. Any current conduction that occurs during the deadtime may occur via the switching transistors' body diodes, causing a voltage drop and undesired power dissipation. If engineered to protect against the full range of process variations, the deadtime may be unnecessarily long and may undesirably limit the efficiency of the SPS.

SUMMARY

Accordingly, there are disclosed herein illustrative test circuits and methods suitable for determining deadtime of a switched power supply (SPS) driver. In some implementations, the test circuits and methods may be embodied as a built-in self-test module integrated into the controller chip for the SPS.

One illustrative test circuit is configured to couple a selected gate signal selected from a high side gate signal of a driver and a low side gate signal of the driver to an input of the driver via a feedback path that causes the selected gate signal to oscillate with a period indicative of propagation time delays of the driver from which a deadtime measurement can be determined.

The illustrative test circuit may include at least one comparator, a pulse generator, an inverter, and an enable gate. The comparator is configured to compare a switching transistor gate signal to a threshold. The pulse generator is coupled to the comparator and configured to provide sense signal having pulses indicating when the switching transistor gate signal exceeds the threshold. The inverter is coupled to the pulse generator to provide an inverted sense signal, and the enable gate is configured to couple the inverted sense signal to a driver input when an enable signal is asserted. If each of the pulses has a predetermined duration, the pulse period is indicative of a rise time delay (or alternatively, a fall time delay) for the switching transistor gate signal. Once rise and fall times for each switching transistor gate signal are measurable, deadtimes can be accurately determined and optimized.

An illustrative test method includes: (i) comparing a switching transistor gate signal to a threshold; (ii) providing a sense signal having a pulse for each time the switching transistor gate signal exceeds the threshold; (iii) inverting the sense signal to provide an inverted sense signal; and (iv) coupling the inverted sense signal to a driver input while an enable signal is asserted.

An illustrative SPS controller includes: a driver and a test circuit. The driver is configured to receive an input signal and to responsively provide a high side gate signal to a high side switching transistor and a low side gate signal to a low side switching transistor. The test circuit is configured to provide a feedback path that converts a selectable one of the high side gate signal and the low side gate signal into a sense signal and that couples a selectable one of the sense signal and an inverted sense signal to the driver as the input signal. The feedback path is configurable to provide the sense signal with a pulse period that is selectively indicative of any one of: a rise time delay of the high side gate signal; a fall time delay of the high side gate signal; a rise time delay of the low side gate signal; and a fall time delay of the low side gate signal.

Each of the foregoing examples can be employed individually or in conjunction and may include one or more of the following optional features in any suitable combination: 1. each of the pulses has a predetermined duration. 2. a second inverter with a selective bypass coupled between the enable gate and the driver input such that the pulse period indicates a rise time delay when the second inverter is bypassed and a fall time delay when the second inverter is not bypassed. 3. a second comparator configured to compare a second switching transistor gate signal to a second threshold. 4. a multiplexer configured to couple a selected one of the sense signal from the comparator and a sense signal from the second comparator to the pulse generator. 5. the multiplexer and selective bypass are configurable to enable the pulse period to indicate in turn each of: the rise time delay for the switching transistor gate signal; the fall time delay for the switching transistor gate signal; the rise time delay for the second switching transistor gate signal; and the fall time delay for the second switching transistor gate signal. 6. the pulse period indicating the rise time delay for the second switching transistor gate signal subtracted from the pulse period indicating the rise time delay for the switching transistor gate signal equals a low-to-high deadtime, and the pulse period indicating the fall time delay for the switching transistor gate signal subtracted from the pulse period indicating the fall time delay for the second switching transistor gate signal equals a high-to-low deadtime. 7. selectively bypassing an inverter in a path to the driver input to obtain a pulse period indicative of a rise time delay; and selectively including the inverter in the path to the driver input to obtain a pulse period indicative of a fall time delay. 8. programming a first adjustable feedback delay based on the measured high-to-low deadtime to provide a desired high-to-low deadtime; and programming a second adjustable feedback delay based on the measured low-to-high deadtime to provide a desired low-to-high deadtime. 9. the test circuit is configured to couple to ATE (automated test equipment) that determines the pulse period of the sense signal for each configuration of the feedback path. 10 the test circuit converts the sense signal into a frequency-divided signal for the ATE. 11. the ATE combines the pulse periods to determine a measured high-to-low deadtime and a measured low-to-high deadtime. 12. a first adjustable feedback delay configured to control an operating high-to-low deadtime; and a second adjustable feedback delay configured to control an operating low-to-high deadtime. 13. a first nonvolatile register configured to be programmed by the ATE based on the measured high-to-low deadtime to set the first adjustable feedback delay; and a second nonvolatile register configured to be programmed by the ATE based on the measured low-to-high deadtime to set the second adjustable feedback delay. 14. the driver includes: a high side path configured to derive the high side gate signal from the input signal; and a low side path configured to derive the low side gate signal from the input signal. 15. the high side path includes a high side path disable gate configured to disable the high side switching transistor during measurements of the rise time delay of the low side gate signal and the fall time delay of the low side gate signal, and the low side path includes a low side path disable gate configured to disable the low side switching transistor during measurements of the rise time delay of the high side gate signal and the fall time delay of the high side gate signal. 16. the high side path further includes a first interlock gate configured to disable the high side switching transistor while the low side gate signal is asserted, and the first interlock gate is configured to receive a low side feedback signal via a low side feedback path that includes a first blocking gate configured to block the low side feedback signal during measurements of the fall time delay of the high side gate signal and the fall time of the low side gate signal. 17. the low side path further includes a second interlock gate configured to disable the low side switching transistor while the high side gate signal is asserted, and the second interlock gate is configured to receive a high side feedback signal via a high side feedback path that includes a second blocking gate configured to block the high side feedback signal during measurements of the rise time delay of the high side gate signal and the rise time delay of the low side gate signal. 18. the high side path further includes a first forcing gate configured to apply a first pulse to assert the high side gate signal, the first pulse ending just before each falling transition of the input signal during measurements of the fall time delay of the high side gate signal, and the low side path further includes a second forcing gate configured to apply a second pulse to assert the low side gate signal, the second pulse ending just before each rising transition of the input signal during measurements of the rise time delay of the low side gate signal. 19. the low side feedback path includes a first substitution gate configured to apply a third pulse to the first interlock gate, the third pulse ending just before each rising transition of the input signal during measurements of the rise time of the high side gate signal, and the high side feedback path includes a second substitution gate configured to apply a fourth pulse to the second interlock gate, the fourth pulse ending just before each falling transition of the input signal during measurements of the fall time delay of the low side gate signal.

BRIEF DESCRIPTION OF THE DRAWINGS

FIG. 4 is a functional block diagram of an illustrative SPS controller under test.

FIG. 5 is a flow diagram of an illustrative testing method.

DETAILED DESCRIPTION

Figure 1:
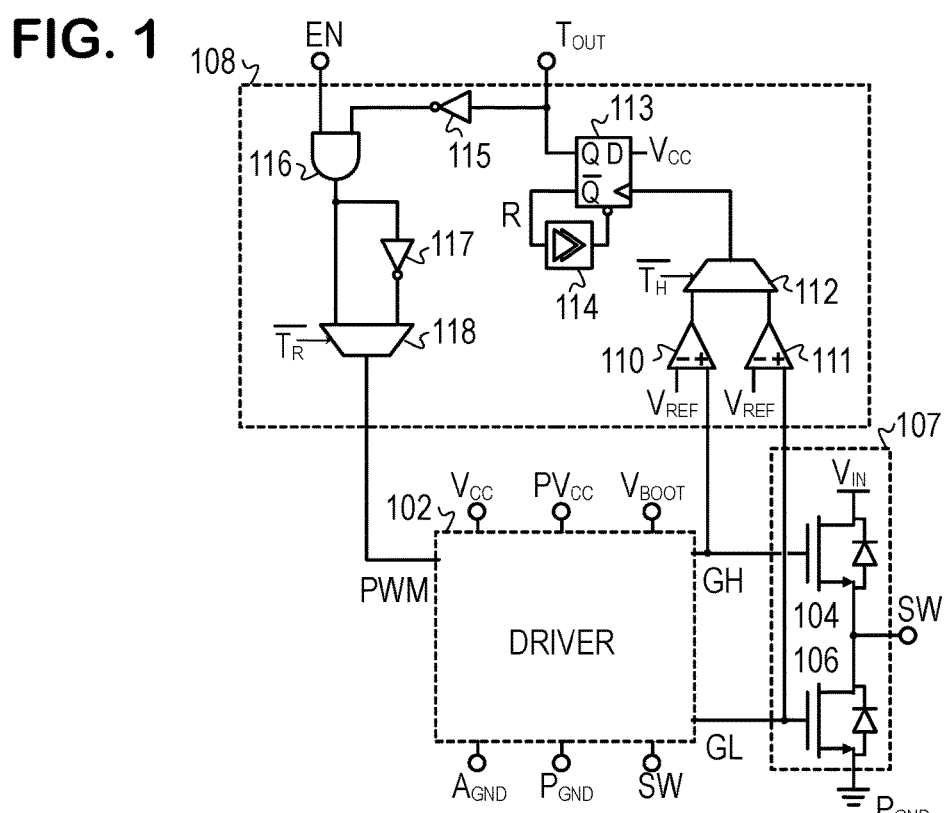
FIG. 1 is a circuit schematic of an illustrative SPS controller.

For simplicity and clarity of illustration, elements in the figures are not necessarily to scale, and the same reference characters in different figures denote the same elements. Although the devices are explained herein as certain n-channel or p-channel devices, a person of ordinary skill in the art will appreciate that complementary devices are also possible in accordance with embodiments of the present invention. It will be appreciated by those skilled in the art that the words during, while, and when, as used herein are not exact terms that mean an action takes place instantly upon an initiating action but that there may be some small but reasonable delay, such as a propagation delay, between the reaction that is initiated by the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to ten or fifteen percent are regarded as reasonable variances from the ideal goal of exactly as described. The drawings and following description are provided for explanatory purposes, not to limit the disclosure. To the contrary, they provide the foundation for one of ordinary skill in the art to understand all modifications, equivalents, and alternatives falling within the scope of the claims.

FIG. 1 is a schematic of an illustrative SPS controller having a driver 102 that supplies gate signals GH and GL to a high side switching transistor 104 and a low side switching transistor 106, respectively. This configuration is particularly suitable for a half-bridge buck converter, but all half-bridge SPS configurations are contemplated and can benefit from the principles disclosed herein. The switching transistors 104, 106 may later be referred to as the output stage 107. When on, high side switching transistor 104 couples a switched node SW to a power domain input voltage $V_{IN}$. When on, low side switching transistor 106 couples the switched node SW to a power domain ground $P_{GND}$. When off, the switching transistors 104, 106 isolate the switched node SW from their respective power domain nodes, though current may still be forced through the body diodes of the switching transistors if the switched node voltage does not remain between the power domain voltages. (Such may be the case if the load includes an inductive component.) The switching transistors 104, 106 are illustrated as n-channel metal oxide semiconductor power field effect transistors (nMOSFETs), but this is not a limitation as p-channel transistors would also be suitable, as would field effect transistors with lateral and vertical double-diffused structures (LDMOS, VDMOS, respectively).

The switched node SW voltage is controllable by suitable pulse width modulation or other duty cycle control of the driver input PWM, enabling the input voltage $V_{IN}$ to be efficiently converted to a desired output voltage with supporting components as provided in any of the known buck, boost, buck-boost, and Cuk converter circuit designs. Better efficiencies are achievable when a given one of the switching transistors is turned on as the other is turned off, but any simultaneous conduction of both switching transistors greatly impairs conversion efficiency and enables potentially damaging levels of current flow. Thus, it is desired to provide for a minimized (but nonzero) deadtime between the turning off of a given switching transistor and the turning on of the other switching transistor.

Accordingly, the illustrative SPS controller includes a built-in self-test circuit 108 enabling accurate determination of each of the propagation time delays between a transition of the driver input PWM signal and the corresponding transitions of the high side gate signal GH and low side gate signal GL. With separable measurements of the various propagation delays, the deadtime measurements can be differentially determined as set forth below.

When an enable signal EN is asserted, test circuit 108 provides a configurable feedback path from a selected one of the gate signals GH, GL to the driver input PWM, operating in the manner of a ring oscillator to produce an oscillating output signal TOUT having a frequency (and thus, an oscillation period) that is indicative of the transition delay to be measured. With the counting of cycles in a given time period, or with the determination of time required for a given number of cycles, arbitrarily precise measurements of the frequency or period can be obtained. As an example, if the oscillating output signal Tour is supplied to a 24-bit counter which is then determined to roll over every 0.510 seconds, the measured delay would be 0.5/2^24, or 30.4 ns. The counter may be built-in or located off-chip or split between the two, e.g., with a frequency-divider provided on the chip and a second off-chip counter used to measure the frequency.

The illustrated test circuit 108 includes a first comparator 110 that compares the high side gate signal GH to a first threshold VREF and a second comparator 111 that compares the low side gate signal GL to a second threshold which in this case is also the first threshold VREF. For accuracy, the voltage references may be set equal to the turn-on voltage thresholds of the switching transistors 104, 106. For at least some of the contemplated testing, the power domain input voltage $V_{IN}$ may be set equal to the power domain ground $P_{GND}$, enabling the comparators 110, 111 to use the same voltage references as the comparison threshold.

A multiplexer 112 may be used to select between the comparator outputs, thereby determining which of the gate signals GH, GL is used as a source of the feedback path signal. In other words, the multiplexer 112 couples a selectable one of the two comparators to the flip flop 113. When low, a first feedback path configuration signal/$T_H$ causes the multiplexer 112 to select the high side gate signal GH, and when high it causes the multiplexer 112 to select the low side gate signal GL. The multiplexer 112 supplies the selected gate signal as a clock input to a D flip flop 113.

The flip flop 113 has an input D tied to $V_{CC}$, the logic domain "high" voltage. (In contrast, the "low" is represented by the logic domain ground voltage $A_{GND}$.) As the clock signal transitions high, the flip flop 113 drives the output signal Q high and the inverted output signal/Q low. The output signal Q may be referred to herein as a sense signal. The inverted output signal/Q serves as a reset signal R, travelling through a delay element 114 to the flip flop's enable input, disabling the flip flop and thereby resetting the output signals (Q goes low,/Q goes high) a predetermined time after the clock signal transition. In this fashion, the reset delay element 114 determines the width of the fixed-width pulse generated by the flip flop each time and clock signal makes an upward transition. Each of the pulses has a predetermined duration during the measurements. This flip flop configuration acts as a pulse generator and is just one example of the various suitable ways in which a clock transition may be translated into a fixed length pulse. Many suitable pulse generator implementations can be found in the open literature. Similarly, various suitable delay element implementations can be found in the open literature including a sequence of gates, a capacitance charged via a resistance or current source, and a serpentine trace.

An inverter 115 inverts the sense signal from the flip flop's output Q, converting a logic high to a logic low and vice versa. The inverter 115 supplies the inverted sense signal to an enable gate 116, shown here as a logical AND gate. The enable gate 116 accepts the enable signal EN, forwarding the inverted sense signal when the enable signal EN is high and blocking the inverted sense signal (i.e., providing a constant low output) when the enable signal EN is low. In this fashion, the feedback path can be enabled or disabled by the enable signal EN.

A second inverter 117 re-inverts the inverted signal, reproducing the sense signal when enabled by the enable gate 116. A second multiplexer 118 provides a selective bypass for the second inverter 117, selecting between the second inverter's input and output (i.e., selecting between the inverted sense signal and the reproduced sense signal) depending on whether a second feedback path configuration signal/$T_R$ indicates that a rise delay time should be measured (configuring the feedback path to bypass the second inverter 117 when the rise-time configuration signal/$T_R$ is low) or indicates that a fall delay time should be measured (selecting the output of the second inverter 117 when the rise-time configuration signal/$T_R$ is high). The output of the second multiplexer 118 is supplied as the driver input signal PWM.

To reiterate one point, the "rise" in rise time delay refers to the rise in the driver input signal and corresponding rise in the switched node signal. While the high side gate signal GH also exhibits a rise with a rise delay time represented by $t_{HR}$, the low side gate signal GL transition is a falling transition. Regardless, the delay between the input rise time and low side falling transition is represented by tur. Similarly, the "fall" in fall time delay refers to the falling transition in the driver input signal. The delay to the corresponding fall in the high side gate signal GH is represented by $t_{HF}$ and the delay to the corresponding rise in the low side gate signal GL is represented by $t_{LF}$.

Taking as a first example the situation in which it is desired to measure the rise delay time of the high side gate signal, the configuration signals/$T_H$ and/$T_R$ may both be set low before the enable signal EN is asserted. With the enable signal, the driver input transitions from low to high. After a rise time delay, comparator 110 detects the high side gate signal exceeding the threshold, causing the flip flop 113 to generate a fixed length pulse, which drives the driver input PWM low for a fixed time before it transitions from low to high again. The process repeats causing the sense signal to oscillate with a period equal to the sum of the high side gate signal's rise time delay and fixed length pulse. (Without the fixed length pulse generator (e.g., the flip flop 113), the period would instead be a function of two variables rather than a variable and a constant.)

Taking as a second example the situation in which it is desired to measure the fall delay time of the low side gate signal, the configuration signals/$T_H$ and/$T_R$ may both be set high before the enable signal EN is asserted. With the enable signal, the driver input transitions from high to low. After a fall time delay, comparator 111 detects the low side gate signal exceeding the threshold, causing the flip flop 113 to generate a fixed length pulse, which drives the driver input PWM high for a fixed time before it transitions from high to low again. Except in circumstances described below, the process repeats causing the sense signal (flip flop output Q) to oscillate with a period equal to the sum of the low side gate signal's fall time delay and fixed length pulse.

In a similar fashion, the configuration signals/$T_H$ and/$T_R$ may be respectively set low and high to cause the flip flop output Q to oscillate with a period equal to the sum of the high side gate signal's fall time delay and the pulse length. If respectively set high and low, the output oscillates with a period equal to the sum of the low side gate signal's rise time delay and the pulse length. In sum, the test circuit is configured to provide a feedback path that converts a selectable one of the high side gate signal and the low side gate signal into a sense signal and that couples a selectable one of the sense signal and an inverted sense signal to the driver as the input signal. The configuration signals configure the feedback path to provide the sense signal with a pulse period that is selectively indicative of any one of: a rise time delay of the high side gate signal; a fall time delay of the high side gate signal; a rise time delay of the low side gate signal; and a fall time delay of the low side gate signal.

Denoting the pulse periods for high side rise time, high side fall time, low side rise time, and low side fall time as $t_{HR}$, $t_{HF}$, $t_{LR}$, and $t_{LF}$, the driver's high-to-low deadtime can be differentially determined by subtracting pulse period indicating the high side fall time delay from the pulse period indicating the low side fall time delay, i.e., as ($t_{LF}$-$t_{HF}$), because the fixed pulse length cancels out of this difference. Similarly, the driver's low-to-high deadtime can be differentially determined by subtracting the pulse period indicating the low side rise time delay from the pulse period indicating the high side rise time delay, i.e., as ($t_{HR}$-$t_{LR}$).

The test circuit 108 illustrated in FIG. 1 enables oscillation of the test output signal Tour for simple designs of the driver 102, enabling the foregoing measurements and calculation of deadtime. However, more sophisticated driver circuit designs may incorporate features such as, e.g., minimum switch times to ensure that full switching is achieved on each cycle and/or an interlock to prevent both gate signals from being asserted at the same time. Such features can inhibit oscillation of the test output signal TOUT, thereby preventing accurate deadtime determination.

Figure 2:
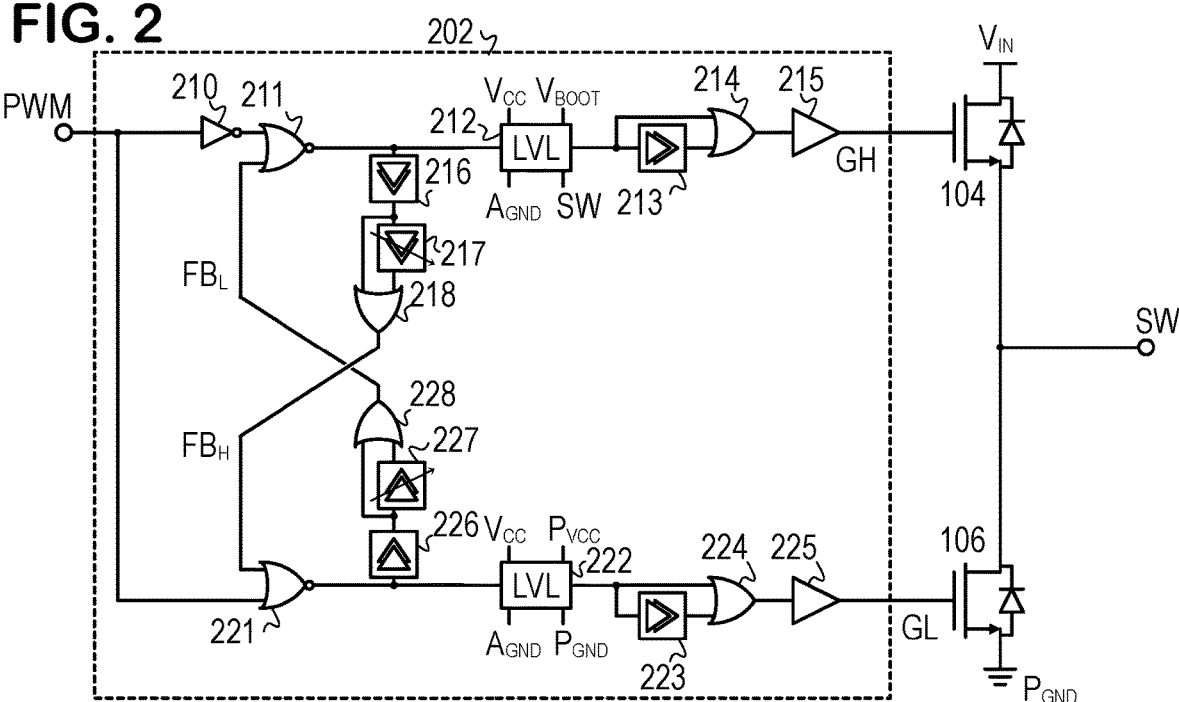
FIG. 2 is a schematic of a first SPS driver.

FIG. 2 is a schematic of such a sophisticated SPS driver 202. An inverter 210 provides an inverted version of the driver input signal PWM for use on a high side path (elements 211-215) while the non-inverted driver input signal PWM is provided to a low side path (elements 221-225). A logical NOR gate 211 serves as an interlock gate to block the inverted driver input signal when the low side feedback signal $FB_L$ is high. A level shifter 212 converts the interlock gate's output from the logic domain voltages ($V_{CC}$ for high, $A_{GND}$ for low) to a high side switching domain voltage ($V_{BOOT}$ for high, SW for low). In normal operating mode, the bootstrap voltage $V_{BOOT}$ may be a floating voltage that is maintained a fixed amount (e.g., 5 volts) above the voltage of the switched node SW. (When operating in a test mode, the $V_{BOOT}$ may be kept at a fixed, lower voltage such as, e.g., $P_{VCC}$, to simplify the test setup.) A delay element 213 takes the high side driver signal from the level shifter and provides a slightly time-delayed version. A logical OR gate 214 combines the high side driver signal with the slightly time-delayed version, thereby producing a filtered driver signal having sustained upward transition to ensure a minimum residence time after each upward transition, ensuring that the switching transistor is fully switched ON. A buffer 215 converts the filtered driver signal into the high side gate signal GH.

On the low side path, a logical NOR gate 221 serves as an interlock gate to block the non-inverted driver input signal when the high side feedback signal $FB_H$ is high. A level shifter 222 converts the interlock gate's output from the logic domain voltages to a low side switching domain voltage ($P_{VCC}$ for high, $P_{GND}$ for low). The $P_{VCC}$ voltage may be maintained at a fixed amount (e.g., 5 volts) above the voltage of the $P_{GND}$ node. A delay element 223 and logical OR gate 224 provide a similar filtering function to high side elements 213, 214, and a buffer 225 converts the filtered driver signal into the low side gate signal GL.

The high side feedback signal $FB_H$ is intended to be asserted at least while the high side gate signal GH is high and similarly the low side feedback signal $FB_L$ is intended to be asserted at least while the low side gate signal GL is high, thereby preventing both gate signals from being high at the same time. The high side feedback path includes a high side interlock delay element 216 that takes the output from the high side interlock gate 211 and provides a delay intended to match the propagation delay of elements 212-215. A high side trim delay element 217 further provides an adjustable feedback delay to the interlock gate output. Finally, a logical OR gate 218 combines the input and output of the high side trim delay element 217 to create the high side feedback signal $FB_H$. Elements 217, 218 operate to extend any assertion of the feedback signal $FB_H$ an adjustable amount beyond the falling edge of the high side gate signal GH, thereby determining the driver's high-to-low deadtime.

In a similar fashion, the low side feedback path includes a low side interlock delay element 226 that takes the output from the low side interlock gate 221 and provides a delay intended to match the propagation delay of elements 222-225. A low side trim delay element 227 further delays the interlock gate output by an adjustable feedback delay amount. A logical OR gate 228 combines the input and output of the low side delay element 227 to create the low side feedback signal $FB_L$. Elements 227, 228 operate to extend any assertion of the feedback signal $FB_L$ an adjustable amount beyond the falling edge of the low side gate signal GL, thereby determining the driver's low-to-high deadtime.

Figure 3:
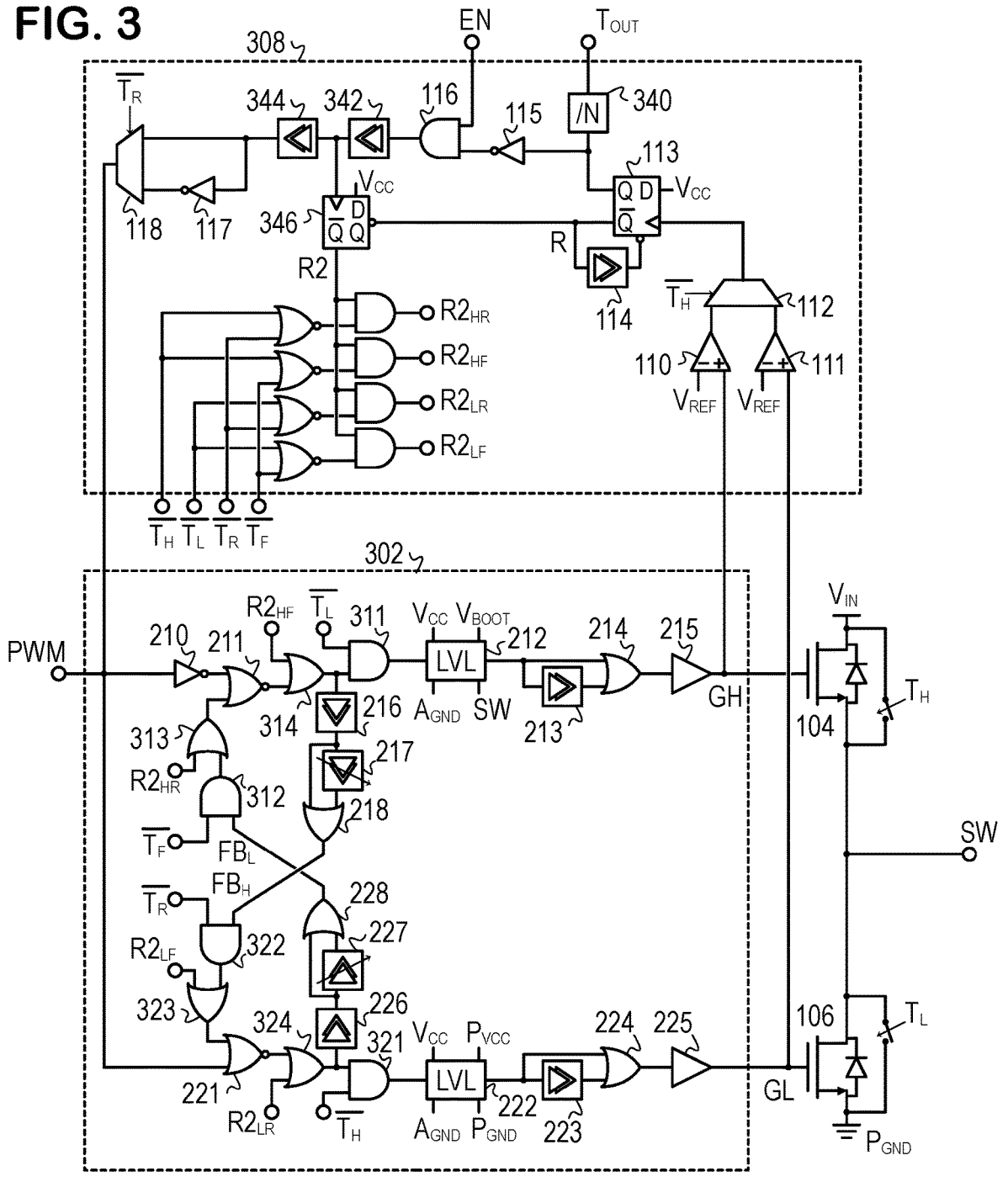
FIG. 3 is a schematic of an illustrative SPS controller with an enhanced driver.

The interlock and various delay elements are important parts of the driver's function. To account for their operation while also preventing them from inhibiting oscillation of the test output signal Tour, the built-in self-test circuitry may be incorporated as shown in FIG. 3. In addition to elements 110-118, test circuit 308 includes a frequency divider 340 to reduce the frequency of the test output TOUT, thereby providing a frequency-divided signal for the ATE. Frequency divider 340 may be a divide-by-N counter with N being a power of two. The period of the test output signal Tour will be N times larger than the period of the test output signal Tour of FIG. 1 but can otherwise be used in the same fashion to determine the deadtimes. The use of an on-chip frequency divider enables accurate measurement of higher frequencies and shorter periods.

If the oscillation period is too short, the flip-flop 113 may not have sufficient time to reset after each transition. To address this possibility, one or more additional delay elements 342, 344 may be introduced into the feedback path, e.g., after the enable gate 116. The added delay elements 342, 344 may introduce a combined delay approximately equal to the reset delay provided by reset delay element 114, such that the leading transition from the output of flip flop 113 cannot reach the driver input PWM before the flip flop 113 is reset. This combined delay may be split into two delay elements with the second added delay element 344 providing, e.g., a 2 ns delay, and the first delay element providing a delay equal to the reset delay minus 2 ns. The intermediate node between the two added delay elements 342, 344 would then provide a signal having a leading edge that precedes the corresponding transition in the driver input PWM by 2 ns. This signal may be provided as a clock input to a second D flip-flop 346 having its D input coupled high ($V_{CC}$) and its enable input coupled to receive the reset signal R from the first flip-flop 113, causing the second flip-flop 346 to create a second reset signal R2 having an upward transition at essentially the same time as a leading edge of the fixed-length pulse generated by the first flip flop 113 and a downward transition just before the leading edge of the fixed length pulse propagates to the driver input PWM. In this example, the second reset signal R2 pulses end 2 ns before the relevant upward or downward transitions in the driver input PWM, but other values may be used where the R2 pulses end "just before" the relevant transitions in the driver input PWM. The time between the ending of the R2 pulses is large enough to prevent them from influencing rise time delay and fall time delay measurements, but small enough that the R2 pulses have sufficient duration to force the driver into the desired pre-transition state.

The test circuit 308 accepts the two configuration signals/$T_H$ and/$T_R$ that are low when the high side path and the rise time delay are to be measured. FIG. 3 also shows configuration signals/$T_L$ and/$T_F$ that are low when the low side path and the fall time delay are to be measured, but these may be generated by inverting the/$T_H$ and/$T_R$ configuration signals. A set of gates combines these configuration signals with the second reset signal R2 to generate four reset signals $R2_{HR}$, $R2_{HF}$, $R2_{LR}$, $R2_{LF}$, corresponding to the four feedback path configurations (high side rise time delay, high side fall time delay, low side rise time delay, low side fall time delay). Only the reset signal for the selected feedback path configuration will be active (i.e., follow the second reset signal R2) and the other three will be inactive (low).

The illustrated driver 302 includes additional gates to apply the four configuration signals/$T_H$,/$T_L$,/$T_R$, and/$T_F$, and the four reset signals $R2_{HR}$, $R2_{HF}$, $R2_{LR}$, $R2_{LF}$. A high side path disable gate 311, shown here as a logical AND gate, may be positioned at the input of the level shifter 212, enabling the/$T_L$ configuration signal to disable the high side path elements 212-215 when the test circuitry is configured to measure the low side delays. Such disabling reduces power consumption during testing and may provide for less signal interference during testing. While the low side path is being tested, an optional shorting switch may connect the source and drain of low side switching transistor 106 to maximize capacitive loading of the low side gate signal GL.

The driver 302 may similarly include a low side path disable gate 321, shown here as a logical AND gate, at the input of level shifter 221 to enable the/$T_H$ configuration signal to disable the low side path elements 221-225 when the test circuitry is configured to measure the high side time delays. While the high side path is being tested, an optional shorting switch may connect the source and drain of the high side switching transistor 104 to maximize capacitive loading of the high side gate signal GH.

In the illustrated driver, the low side feedback signal $FB_L$ is coupled to the interlock gate 211 via a blocking gate 312, shown here as a logical AND gate, and a substitution gate 313, shown here as a logical OR gate. The other input of the blocking gate 312 is the/$T_F$ configuration signal, enabling the/$T_F$ configuration signal to block the low side feedback signal $FB_L$ when the test circuitry 308 is configured for fall time delay testing. The other input of the substitution gate 313 is the $R2_{HR}$ reset signal, which (when the test circuit is configured for high side rise time delay testing) represents a "perfectly timed" low side feedback signal $FB_L$ that goes low just before the output of inverter 210 goes low, enabling measurement of the high side rise time delay without any added delay from the low side interlock elements 226-228. Also, when the test circuit is configured for high side rise time delay testing, the blocking gate 312 is configured to recouple the low side feedback signal $FB_L$ to the interlock gate 211.

In the illustrated driver 302, a forcing gate 314, shown here as a logical OR gate, operates on the output signal from the interlock gate 211 and the $R2_{HF}$ reset signal to produce the high side drive signal that is coupled by the high side path disable gate 311 to the level shifter 212. When asserted, the $R2_{HF}$ reset signal forces the high side drive signal high. The $R2_{HF}$ reset signal goes low just before the falling edge of the driver input PWM, enabling measurement of the high side fall time delay.

Similar elements are provided for the low side driver path. In the illustrated driver, the high side feedback signal $FB_H$ is coupled to the interlock gate 221 via a blocking gate 322 and a substitution 323 (shown as logical AND and logical OR, respectively). The other input of the blocking gate 322 is the/$T_R$ configuration signal, enabling the/$T_R$ configuration signal to block the high side feedback signal $FB_H$ when the test circuitry 308 is configured for rise time delay testing. The other input of the substitution gate 323 is the $R2_{LF}$ reset signal, which (when the test circuit is configured for low side fall time delay testing) represents a "perfectly timed" high side feedback signal $FB_H$ that goes low just before the falling edge of the driver input PWM, enabling measurement of the low side fall time delay without any added delay from the high side interlock elements 216-218. When the test circuit is instead configured for fall time delay testing, the blocking gate 322 is configured to recouple the high side feedback signal $FB_H$ to the interlock gate 221.

In the illustrated driver 302, a forcing gate 324, shown here as a logical OR gate, operates on the output signal from the interlock gate 221 and the $R2_{LR}$ reset signal to produce the low side drive signal that is coupled by the low side disable gate 321 to the level shifter 222. When asserted, the $R2_{LR}$ reset signal forces the low side drive signal high. The $R2_{LR}$ reset signal goes low just before the rising edge of the driver input PWM, enabling measurement of the low side rise time delay.

FIG. 4 is a functional block diagram of an illustrative SPS controller 402 under test by automated test equipment (ATE) 400. The testing can be performed at the wafer stage (i.e., before singulation of the dies) or after the devices have been packaged into chips with pins or contacts for external I/O. Typically the ATE 400 performs concurrent testing of multiple devices. The ATE 400 supplies power and digital test patterns to each device via, e.g., an inter-integrated circuit ($I^2C$) bus, and collects test results to evaluate each device. The controller device 402 includes a test interface 404 such as a JTAG Test Access Port to enable the ATE 400 to access configuration registers of the controller device 402 including configuration registers for the built-in self-test circuit 308. The ATE 400 causes the built-in self-test circuit 308 to configure the driver 302 for testing, collects high side and low side rise time delay and fall time delay measurements, determines the deadtimes, and programs nonvolatile registers in the controller device 402 to trim the deadtimes to an optimal value, thereby enhancing the operating efficiency of the SPS.

FIG. 5 is a flow diagram of an illustrative testing method. In block 502, the ATE 400 places the device 402 in a test mode in which the power domain voltages $V_{IN}$, $P_{GND}$ are set to predetermined values and the test access port 404 takes control of the configuration signals/$T_H$,/$T_L$,/$T_R$, and/$T_F$, and the test enable signal EN.

In block 504, the test access port 404 sets the configuration signals to configure the test circuit 308 and driver 302 for low side rise time delay testing. In block 506, the test access port 404 enables the test circuit 308 and monitors the test output signal TOUT to measure the oscillation period that indicates the low side rise time delay.

In block 508, the test access port 404 sets the configuration signals to configure the test circuit 308 and driver 302 for high side fall time delay testing. In block 510, the test access port 404 enables the test circuit 308 and monitors the test output signal TOUT to measure the oscillation period that indicates the high side fall time delay.

By controlling the feedback signals $FB_L$ and $FB_H$, trim delay elements 227, 217 influence high side rise delay time and low side fall delay time, respectively. In block 512, these trim delay elements may possess or be programmed with a default setting, e.g., a trim code of "0000" corresponding to a minimum trim setting. Alternatively, the default may correspond to a mid-range setting, a maximum trim setting, or an average trim value derived from previous tests.

In block 514, the test access port 404 sets the configuration signals to configure the test circuit 308 and driver 302 for high side rise time delay testing. In block 516, the test access port 404 enables the test circuit 308 and monitors the test output signal TOUT to measure the oscillation period that indicates the high side rise time delay.

In block 518, the ATE subtracts the high side rise time delay measurement from the low side rise time delay measurement to calculate the low-to-high deadtime. The ATE determines whether the calculated deadtime matches a target, e.g., 3 ns. If not, the ATE causes the test access port to adjust the setting for trim delay element 227, e.g., by reprogramming a nonvolatile register for the trim delay element. The ATE initiates a repetition of blocks 514-518 to obtain a new high side rise time delay measurement and newly calculated low-to-high deadtime measurement.

The loop 514-520 may be repeated until the target is achieved, after which in block 522 the test access port 404 sets the configuration signals to configure the test circuit 308 and driver 302 for low side fall time delay testing. In block 524, the test access port enables the test circuit 308 and monitors the test output signal Tour to measure the oscillation period that indicates the low side fall time delay.

In block 526, the ATE 400 subtracts the low side fall time delay measurement from the high side fall time delay measurement to calculate the high-to-low deadtime. As before, the ATE determines whether the calculated deadtime matches the target (which may be the same as, or different from, the low-to-high deadtime target). If not, the setting for trim delay element 217 is adjusted (e.g., by reprogramming a nonvolatile register for the trim delay element) and blocks 522 to 528 are repeated until the target is achieved. Once the trim delay element settings are satisfactory, the ATE 400 takes the device 402 out of test mode and reports completion of the process.

Numerous variations will be evident to those of ordinary skill in the art upon reviewing the foregoing. Various arrangements of logical AND, OR, NAND, NOR, NOT, and different flip flop types, can be designed to provide equivalent results and it would be within the ability of one of ordinary skill to derive such alternative arrangements from the arrangements that have been disclosed herein.

What is claimed is:

1. A test circuit configured to couple a selected gate signal selected from a high side gate signal of a driver and a low side gate signal of the driver to an input of the driver via a feedback path that causes the selected gate signal to oscillate with periods indicative of propagation time delays of the driver from which a deadtime measurement can be differentially determined.

2. The test circuit of claim 1, wherein the propagation time delays include:
   a rise time delay of the high side gate signal;
   a fall time delay of the high side gate signal;
   a rise time delay of the low side gate signal; and
   a fall time delay of the low side gate signal, and
   wherein the deadtime measurement is in a set consisting of:
   a high-to-low deadtime corresponding to a difference between the period indicating the fall time delay of the low side gate signal and the period indicating the fall time delay of the high side gate signal; and
   a low-to-high deadtime corresponding to a difference between the period indicating the rise time delay of the high side gate signal and the period indicating the rise time delay of the low side gate signal.

3. An SPS (switched power supply) controller that comprises:
   a driver configured to receive an input signal and to responsively provide a high side gate signal to a high side switching transistor and a low side gate signal to a low side switching transistor; and
   a test circuit configured to provide a feedback path that converts a selectable one of the high side gate signal and the low side gate signal into a sense signal and that couples a selectable one of the sense signal and an inverted sense signal to the driver as the input signal, the feedback path having multiple configurations, each of the multiple configurations providing the sense signal with a pulse period that indicates a corresponding one of:
   a rise time delay of the high side gate signal;
   a fall time delay of the high side gate signal;
   a rise time delay of the low side gate signal; and
   a fall time delay of the low side gate signal.

4. The SPS controller of claim 3, wherein the test circuit is configured to couple to ATE (automated test equipment) that determines the pulse period of the sense signal for each of the multiple configurations of the feedback path.

5. The SPS controller of claim 4, wherein the test circuit is configured to convert the sense signal into a frequency-divided signal for the ATE.

6. The SPS controller of claim 4, wherein the ATE combines the pulse periods to determine a calculated high-to-low deadtime and a calculated low-to-high deadtime.

7. The SPS controller of claim 6, further comprising:
   a first adjustable feedback delay configured to control an operating high-to-low deadtime; and
   a second adjustable feedback delay configured to control an operating low-to-high deadtime.

8. The SPS controller of claim 7, further comprising:
   a first nonvolatile register configured to be programmed by the ATE based on the calculated high-to-low deadtime to set the first adjustable feedback delay; and
   a second nonvolatile register configured to be programmed by the ATE based on the calculated low-to-high deadtime to set the second adjustable feedback delay.

9. The SPS controller of claim 3, wherein the feedback path comprises:

a first comparator configured to compare the high side gate signal to a threshold;

a second comparator configured to compare the low side gate signal to the threshold;

a pulse generator coupled to a selectable one the first comparator and the second comparator and configured to provide the sense signal with pulses indicating when the threshold is exceeded;

an inverter coupled to the pulse generator to provide the inverted sense signal; and an enable gate configured to couple the inverted sense signal to a driver input to enable the feedback path when an enable signal is asserted.

10. The SPS controller of claim 9, wherein the feedback path further comprises a bypassable inverter to select between rise time delay measurement and fall time delay measurement.

11. The SPS controller of claim 3, wherein the driver includes:

a high side path configured to derive the high side gate signal from the input signal; and a low side path configured to derive the low side gate signal from the input signal, wherein the high side path includes a high side path disable gate configured to disable the high side switching transistor during measurements of the rise time delay of the low side gate signal and the fall time delay of the low side gate signal, and wherein the low side path includes a low side path disable gate configured to disable the low side switching transistor during measurements of the rise time delay of the high side gate signal and the fall time delay of the high side gate signal.

12. The SPS controller of claim 11, wherein the high side path further includes a first interlock gate configured to disable the high side switching transistor while the low side gate signal is asserted, wherein the first interlock gate is configured to receive a low side feedback signal via a low side feedback path that includes a first blocking gate configured to block the low side feedback signal during measurements of the fall time delay of the high side gate signal and the fall time delay of the low side gate signal, wherein the low side path further includes a second interlock gate configured to disable the low side switching transistor while the high side gate signal is asserted, and wherein the second interlock gate is configured to receive a high side feedback signal via a high side feedback path that includes a second blocking gate configured to block the high side feedback signal during measurements of the rise time delay of the high side gate signal and the rise time delay of the low side gate signal.

13. The SPS controller of claim 12, wherein the high side path further includes a first forcing gate configured to apply a first pulse to assert the high side gate signal, the first pulse ending just before each falling transition of the input signal during measurements of the fall time delay of the high side gate signal, and wherein the low side path further includes a second forcing gate configured to apply a second pulse to assert the low side gate signal, the second pulse ending just before each rising transition of the input signal during measurements of the rise time delay of the low side gate signal.

14. The SPS controller of claim 12, wherein the low side feedback path includes a first substitution gate configured to apply a third pulse to the first interlock gate, the third pulse ending just before each rising transition of the input signal during measurements of the rise time delay of the high side gate signal, and wherein the high side feedback path includes a second substitution gate configured to apply a fourth pulse to the second interlock gate, the fourth pulse ending just before each falling transition of the input signal during measurements of the fall time delay of the low side gate signal.

15. A test circuit that comprises:

a comparator configured to compare a switching transistor gate signal to a threshold;

a pulse generator coupled to the comparator and configured to provide sense signal having pulses indicating when the switching transistor gate signal exceeds the threshold;

an inverter coupled to the pulse generator and configured to provide an inverted sense signal; and an enable gate configured to couple the inverted sense signal to a driver input when an enable signal is asserted.

16. The test circuit of claim 15, wherein each of the pulses has a predetermined duration, yielding a pulse period indicative of a rise time delay for the switching transistor gate signal.

17. The test circuit of claim 15, wherein each of the pulses has a predetermined duration, and wherein the test circuit further comprises a second inverter with a selective bypass coupled between the enable gate and the driver input, yielding a pulse period indicating a rise time delay when the second inverter is bypassed, and indicating a fall time delay when the second inverter is not bypassed.

18. The test circuit of claim 17, further comprising:

a second comparator configured to compare a second switching transistor gate signal to a second threshold; and a multiplexer configured to couple a selected one of the sense signal from the comparator and a sense signal from the second comparator to the pulse generator, the multiplexer and selective bypass enabling the pulse period to indicate in turn each of:

the rise time delay for the switching transistor gate signal;

the fall time delay for the switching transistor gate signal;

the rise time delay for the second switching transistor gate signal; and the fall time delay for the second switching transistor gate signal.

19. The test circuit of claim 18, wherein the pulse period indicating the rise time delay for the switching transistor gate signal subtracted from the pulse period indicating the rise time delay for the second switching transistor gate signal equals a low-to-high deadtime, and the pulse period indicating the fall time delay for the second switching transistor gate signal subtracted from the pulse period indicating the fall time delay for the switching transistor gate signal equals a high-to-low deadtime.

20. A test method that comprises:

with a comparator, comparing a switching transistor gate signal to a threshold;

with a pulse generator, providing a sense signal having a pulse for each time the switching transistor gate signal exceeds the threshold;

with an inverter, inverting the sense signal to provide an inverted sense signal; and with an enable gate, coupling the inverted sense signal to a driver input while an enable signal is asserted.

21. The test method of claim 20, wherein each of the pulses has a predetermined duration, yielding a pulse period indicative of a rise time delay for the switching transistor gate signal.

22. The test method of claim 20, further comprising, with a multiplexer:

selectively bypassing an inverter in a path to the driver input to obtain a pulse period indicative of a rise time delay; and selectively including the inverter in the path to the driver input to obtain a pulse period indicative of a fall time delay.

23. The test method of claim 22, further comprising:

with a second comparator, comparing a second switching transistor gate signal to a second threshold; and with a second multiplexer, selecting whether the sense signal has a pulse for each time the switching transistor gate signal exceeds the threshold or has a pulse for each time the second switching transistor gate signal exceeds the second threshold to obtain a pulse period for each of:

the rise time delay for the switching transistor gate signal;

the fall time delay for the switching transistor gate signal;

the rise time delay for the second switching transistor gate signal; and the fall time delay for the second switching transistor gate signal.

24. The test method of claim 23, further comprising:

subtracting the pulse period indicating the fall time delay for the second switching transistor gate signal from the pulse period indicating the fall time delay for the switching transistor gate signal to obtain a calculated high-to-low deadtime; and subtracting the pulse period indicating the rise time delay for the switching transistor gate signal from the pulse period indicating the rise time delay for the second switching transistor gate signal to obtain a calculated low-to-high deadtime.

25. The test method of claim 24, further comprising:

programming a first adjustable feedback delay based on the calculated high-to-low deadtime to provide a desired high-to-low deadtime; and programming a second adjustable feedback delay based on the calculated low-to-high deadtime to provide a desired low-to-high deadtime.

* * * * *